United States Patent
Iverson

(10) Patent No.: US 10,634,992 B2
(45) Date of Patent: Apr. 28, 2020

(54) LAYER CLASS RELATIVE DENSITY FOR TECHNOLOGY MODELING IN IC TECHNOLOGY

(71) Applicant: Synopsys, Inc., Mountain View, CA (US)

(72) Inventor: Ralph Iverson, Arlington, MA (US)

(73) Assignee: Synopsys, Inc., Mountain View, CA (US)

(*) Notice: Subject to any disclaimer, the term of this patent is extended or adjusted under 35 U.S.C. 154(b) by 115 days.

(21) Appl. No.: 15/413,379

(22) Filed: Jan. 23, 2017

(65) Prior Publication Data

US 2017/0228492 A1    Aug. 10, 2017

Related U.S. Application Data

(60) Provisional application No. 62/296,586, filed on Feb. 17, 2016, provisional application No. 62/281,718, filed on Jan. 21, 2016.

(51) Int. Cl.
*G06F 17/50* (2006.01)
*G03F 1/70* (2012.01)
*G03F 7/20* (2006.01)

(52) U.S. Cl.
CPC .............. *G03F 1/70* (2013.01); *G03F 7/705* (2013.01); *G03F 7/70466* (2013.01)

(58) Field of Classification Search
USPC .................................. 716/51, 52, 53, 54, 55
See application file for complete search history.

(56) References Cited

U.S. PATENT DOCUMENTS

| | | | | |
|---|---|---|---|---|
| 7,784,010 B1* | 8/2010 | Balsdon | ............. | G06F 17/5077 716/118 |
| 7,818,707 B1* | 10/2010 | Gennari | ............. | G06F 17/5068 716/104 |
| 8,484,607 B1* | 7/2013 | Tang | .................... | G03F 7/70466 716/136 |
| 8,627,245 B1* | 1/2014 | Banerjee | ............. | G03F 7/70466 716/50 |
| 8,647,893 B1* | 2/2014 | Agarwal | ............. | G06F 17/5081 257/E21.522 |
| 2003/0021000 A1* | 1/2003 | Takizawa | .......... | G02F 1/133514 359/263 |
| 2004/0223639 A1* | 11/2004 | Sato | .................... | G01R 31/2831 382/145 |
| 2015/0089457 A1* | 3/2015 | Agarwal | .................. | G03F 1/70 716/52 |
| 2016/0247714 A1* | 8/2016 | Song | .................... | G06F 17/5077 |

\* cited by examiner

*Primary Examiner* — Brian Ngo
(74) *Attorney, Agent, or Firm* — HIPLegal LLP; Judith Szepesi

(57) ABSTRACT

A method and apparatus of a novel modeling scheme for performing optical lithography simulation for a multi-color layer fabrication process is described. The method interpolates for simulation use between test or experimental data or descriptions to more accurately apply color differentiated parameters to the model creation and lithography simulation.

21 Claims, 6 Drawing Sheets

D[1]=100%
D[2]= 0%

D[1]=66.7%
D[2]=33.3%

D[1]=50%
D[2]= 50%

D[1]=33.3%
D[2]=66.7%

- Consider the case that thickness tables or expressions are defined for three patterns:
  - …AAAAA…: D[1]=100%, D[2]=0% (*THK000()*)
  - …ABABAB…: D[1]=50%, D[2]=50% (*THK050()*)
  - …BBBBBB…: D[1]=0%, D[2]=100% (*THK100()*)

- When the relative density D[2] is 40%, a linear interpolation uses the following expression for thickness $$0.2*THK000()+0.8*THK050()$$

— Interpolation methods other than linear are possible

Fig. 4A

```
qtfTable thk(D[2])
0    0.5    1.0
THK000 THK050 THK100
qtfEndTable
```

LAYER CLASS RELATIVE DENSITY FOR TECHNOLOGY MODELING IN IC TECHNOLOGY

RELATED APPLICATION

The present invention claims priority to U.S. Provisional Patent Application 62/281,718 and U.S. Provisional Patent Application 62/296,586, and incorporates both applications by reference in their entirety.

FIELD

The present invention relates to electronic design automation (EDA) and in particular to photolithography processes.

BACKGROUND

Photolithography is a process used in micro-fabrication to pattern the bulk of a substrate. It uses light to transfer a geometric pattern from an optical mask to a light-sensitive chemical "photoresist," or simply "resist," on the substrate. The pattern in the resist is created by exposing it to light with a projected image using an optical mask.

As semiconductor feature sizes continue to shrink further below the exposure wavelength, additional elements of the integrated circuit design become increasingly significant factors impacting the resulting integrated circuit (IC) chip. In addition, the cost of manufacturing advanced mask sets is steadily increasing as technology becomes more and more complex in addition to increasing turn-around time in semiconductor manufacturing. As a result, computer simulations of the photolithography process and the impact of accurate photolithography modeling becomes more important to ensure efficient and effective cost and time of IC chip manufacture.

Electronic Design Automation (EDA) software is a term for the collective tools supporting design and verification of IC chips. Some EDA tools create models of elements of the IC design for the photolithography process. Effective photolithography modeling includes capacitive or resistive effects of the elements of the IC design and the impact of their relative positions. Frequently, these effects are modeled in separate tools within EDA software. For example, the Synopsys (formerly Magma) tool family named QuickCap is a capacitance extractor. The QuickCap tool uses a geometry pre-processor named gds2cap to translate layout data into a 3D representation and reduced SPICE netlist with resistance and capacitance, among other tasks. A language named QTF is used by gds2cap. As another example, the Synopsys tool family named STAR is a similar capacitance extractor. A tool within STAR is used to translate layout data, using the ITF language. Other tools have solutions in this space, such as Avanti RCXT, Mentor Calibre, and Cadence Fire&Ice.

In an effort to aid in resolution of features in the semiconductor process, designers and fabricators have gone to a multi-exposure approach of photolithography. Within the same layer of an integrated circuit, two or more exposures are made using different portions of the IC design at that layer in an attempt to resolve smaller features more clearly. Specifically, that single layer will have multiple masks used to create the features within that layer. This is called multi-patterning. Unfortunately, existing techniques to accurately model capacitive or resistive effects of multi-patterning are inaccurate. EDA tool creators and fabricators have been trying to increase the accuracy of models to compensate for the effects of multi-patterning, but have not been successful thus far and do not match, for example, thicknesses in all patterns of a multi-pattern approach.

BRIEF DESCRIPTION OF THE FIGURES

The present invention is illustrated by way of example, and not by way of limitation, in the figures of the accompanying drawings and in which like reference numerals refer to similar elements and in which:

FIGS. 4A and 4B are embodiments of calculations of process information for relative color density in accordance with the present invention.

DETAILED DESCRIPTION

When a silicon process uses multi-patterning, such as double patterning, to create features, the different patterns of metal lines within the same layer are called "layer classes", with each pattern of metal lines a single layer class. Another term for "layer class" is "color". When multi-patterning a layer of metal lines, the first pattern of metal lines to be fabricated within the layer is called the "A" color (or layer class), the second pattern of metal lines to be fabricated within that same layer is called the "B" color, and so on. References to "color" or "layer class" are interchangeable and are not intended to be limiting to one particular process, fabricator or company nomenclature.

The present solution provides an improved method and apparatus for modeling thickness of wires or resistance in a multi-patterned layer. Models that do not account for layer class try (and often fail) to model using secondary characteristics that are a function of the layer class, without actually adding a layer-class parameter. The relative density of a layer class is a measure of a characteristic of a layer class divided by the sum of the measures of all layer classes. An example of a simple measure is the area or (equivalently) the area-based density. Another possible measure is the line length: a wide line and a narrow line with the same length have the same measure.

In one embodiment such calculations involve all objects within a window. A relative layer-class density is a weighted average of values based on various window sizes, in one embodiment. For thickness or loading effect, this allows direct representation of thickness table based on patterns. This avoids numerical errors trying to fit a polynomial expression of two variables to data that is a function of three variables (width, spacing or density, and layer class).

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Figure 1A:
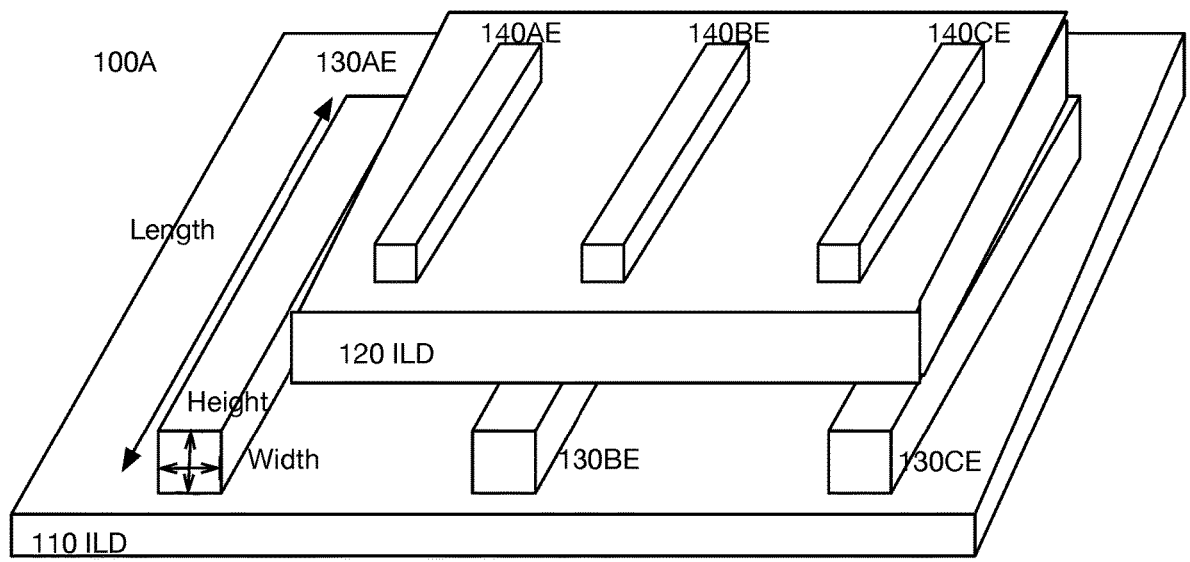
FIG. 1A is a diagram of a set of multi-patterning layer classes within a layer of a fabricated IC chip.
Figure 1B:
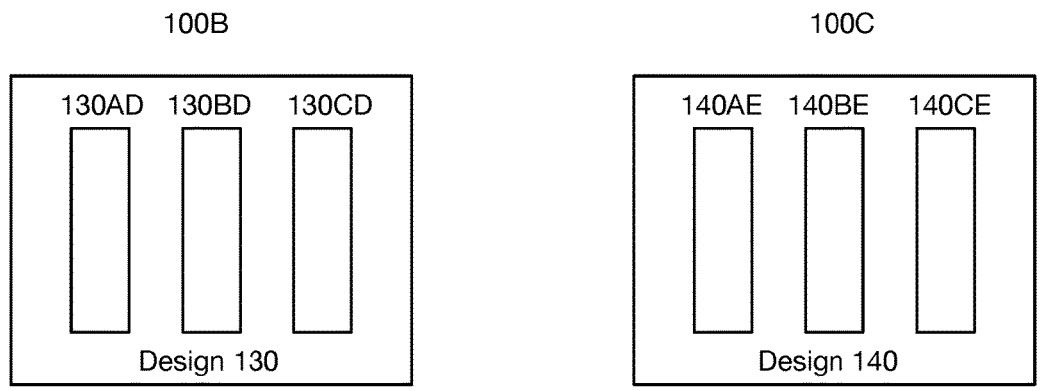
FIG. 1B is a diagram of a corresponding set of multi-patterning layer within a layer of an IC design.

FIG. 1A is a diagram of a set of multi-patterning layers within a layer of a fabricated IC chip and FIG. 1B is a diagram of a corresponding set of multi-patterning layer within a layer of an IC design.

FIG. 1A includes set of fabricated or etched elements 100A including an Inter Layer Dielectric (ILD) 110 below a set of metal lines 130 below an ILD 120 below a set of metal lines 140. FIG. 1B includes an IC design 100B including drawn metals lines 130 corresponding to printed metal lines 130 in FIG. 1A and an IC design 100C including drawn metal lines 140 corresponding to etched metal lines 140 in FIG. 1A.

A stack is a set of layers of dielectric within an IC. The inter-metal dielectric (IMD) is the dielectric within the metallization layers of the stack hosting the metal interconnect of the IC. The IMD between etched metal lines 130 and the IMD between etched metal lines 140 is not shown in FIG. 1A. The metal lines created during the photolithography process have many characteristics, including thickness, length and width. These dimensions are shown for etched metal line 130AE in FIG. 1A and drawn metal line 130AE in FIG. 1B.

Metal line thickness varies, and this thickness variation is dependent on factors such the variation of the thickness of the IMD (around metal lines in the same layer), a global thickness variation affecting everything higher in the stack, variations of the drawn or etched width of a particular metal line, and local thickness variation on a line by line basis.

Global thickness variation in one embodiment is a gradual variation based on averages in the region. Some modeling uses the width of metal lines in a layer and the density of those metal layers to model IMD thickness variation.

Similar to IMD, the ILD between different metallization layers, such as ILD 110 and 120, and the associated ILD variation in fabrication produce a global effect called a loading effect. Some modeling uses width of the upper layer metal lines and their spacing to model ILD thickness variation. In other words, some modeling uses the IMD rather than the ILD to model ILD thickness variation to measure loading effect.

Spacing is a local measurement, indicating spaces between the metal lines. Density is an average density of metal in an area of evaluation. Within a window, density is the area of metal divided by the area of the window.

A multi-patterned layer in integrated-circuit technology involves multiple masks. A layer class is a subset of the resultant wires (on a layer) with some different technology description (etch tables, for example), due to the multiple masks. When mask A is used to generate some lines, and then mask B is used to generate other lines, the two layer classes correspond to the two masks, A and B. When the edges of mask A generate different types of lines, depending on whether mask B is present, the two layer classes correspond to whether or not they are under mask B.

Some characteristics such as resistance or edge shape may be local, only depending on the layer class of the wire. Some characteristics such as etch may also depend on the layer class of the neighbor. In one embodiment, the system models a characteristic such as layer thickness that might be described as a function of the average layer class in the area. In one embodiment, the system uses a parameter that represents the relative density of a layer class.

In one embodiment, the relative density of a layer class is a measure of the amount of that layer class divided by the sum of the measures of all layer class. One embodiment uses the area or (equivalently) the area-based density: Divide the area of metal in one class on a given layer by the total area for that layer (all classes). Another embodiment uses the line length, by dividing the length of metal in one class on a given layer by the total length for that layer (all classes). A relative layer-class density in one embodiment is the weighted average of values based on various window sizes.

Models that do not account for color frequently attempt to use secondary characteristics that are influenced by color, without directly adding a color parameter or dependency, resulting in ineffective models.

The system described provides Smooth Global Variation, because abrupt variation cannot be represented in a consistent physical model. A physical model of thickness variation (including loading effect) should have a smooth dielectric-stack variation, and any local variation should involve at most only metal thickness and associated conformal layers, not the thickness of a dielectric layer. In one embodiment, this is accomplished by using density-effective values for width and spacing used in global-thickness-variation and loading-effect models.

Another goal in one embodiment is Matching "Pattern" Results. A thickness-variation approach should agree with measured metal thickness and the dielectric stack for each characterized pattern. As noted above, a pattern consists of an array of lines on a layer with uniform drawn width (Wdr) and drawn spacing (Sdr). The lines can all be of one layer class (color) (AAA and BBB), or they can alternate (ABA and BAB). To be physically self-consistent, the dielectric stack should be the same for a pair of ABA and BAB patterns (same Wdr and Sdr) because these two patterns are characterized using a single . . . ABABAB . . . structure. For any given width and spacing, matching each pattern thickness is better than simply matching some average of the different patterns (AAA, BBB, ABA, BAB).

Another goal, in one embodiment is Reasonable State Variables. The parameters controlling a thickness-variation approach for general layouts should be based more-or-less on the physics (mechanics) behind thickness variation. Based on past modeling, the IMD thickness (thickness variation) is a function of width and density. Also based on past modeling, the ILD thickness (loading) is a function of width and "spacing." Using appropriate parameters gives more accurate results for layouts that do not match any particular pattern.

Another goal is to enable Straight-Forward Modeling. A thickness-variation modeling strategy that minimizes the amount of preprocessing of measured data (thickness) also minimizes risks of errors. The two-variable thickness polynomial depends on a complicated multi-step approach requiring that a coefficient-driven formula be fitted to data, and the fit is not very good, especially for thickness data involving layer class (color). In one embodiment, the method more directly uses the measured thickness data, which requires less effort and is more robust (smaller chance of problems).

Figure 2:
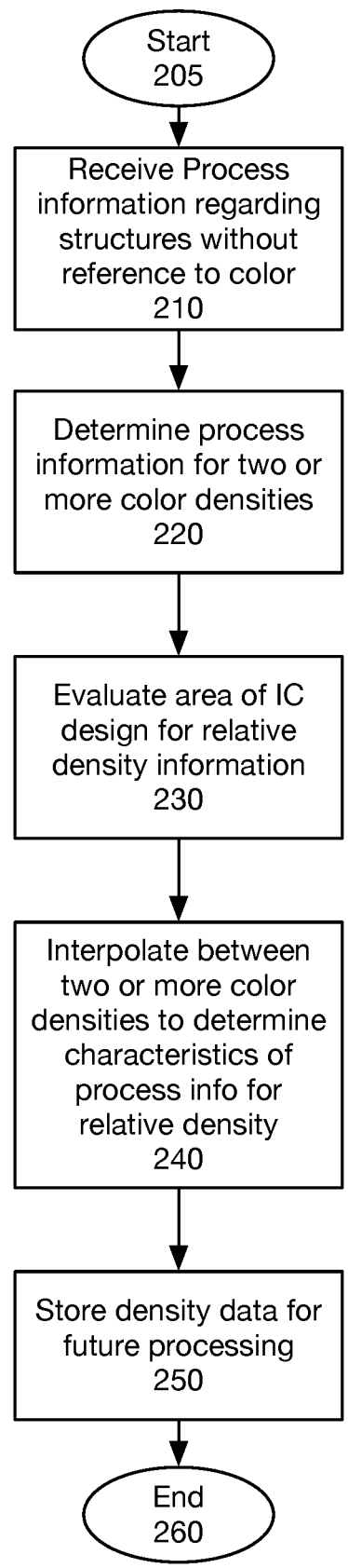
FIG. 2 is an overview flowchart of one embodiment of receiving process information from test structures without reference to color in a photolithography simulation process for multi-layer patterning.

FIG. 2 is an overview flowchart of one embodiment of receiving process information from test structures without reference to color in a photolithography simulation process for multi-layer patterning. At block 210, information is received relating to the fabrication process that does not expressly include color. In one embodiment, this information represents thickness. In one embodiment, this information is in the form of a polynomial. In one embodiment, the polynomial is fit to test structures. In one embodiment, this information is in the form of a table. Other types of information may take other forms.

Because the information received does not expressly account for color, the information is tied to color by evaluating the information at known color groupings, such as 100% color A, 100% color B, or 50% color A and 50% color B in step 220. A design can then be evaluated for color density in step 230. In one embodiment, a moving window through the design determines the relative color density for a region in step 240, to provide a smooth resolution. In one embodiment, the window is a 50 micron window. In one embodiment, a grid is imposed over the design to determine relative color density for a region. When the relative color density for the region has been determined, that relative color density may be evaluated from the known color grouping information.

FIGS. 3A-3D are relative color density distributions. Information, such as that obtained in step 210 of FIG. 2, may be evaluated at one or more relative densities. Evaluating such information for the relative color density of FIG. 3A results in a total color A portion of 100% and a total color B portion of 0%. In another relative color density of a total color A portion of 0% and a total color B portion of 100% (not shown), the information may also be evaluated. With those known color groupings, other relative color densities may be calculated.

Figure 3A:
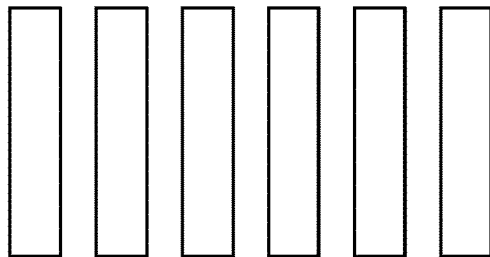
FIGS. 3A-3D are relative color density distributions in accordance with an embodiment of the present invention.
Figure 3B:
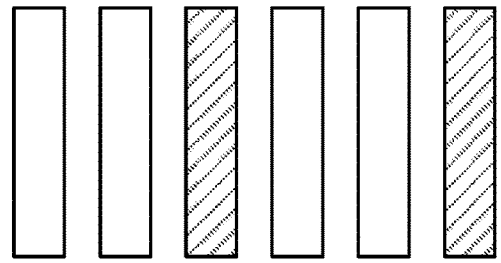

FIG. 3B is an example of a relative color density of ⅔ color A, ⅓ color B, in this case, AABAAB. In one embodiment, process information for the relative color density of FIG. 3B is calculated as a linear interpolation between that of FIG. 3A and FIG. 3C, for example resulting in an appropriate thickness to use for that color density.

Figure 3C:
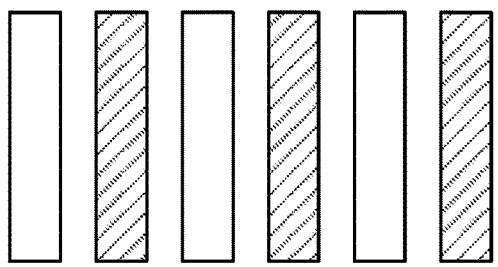
Figure 3D:
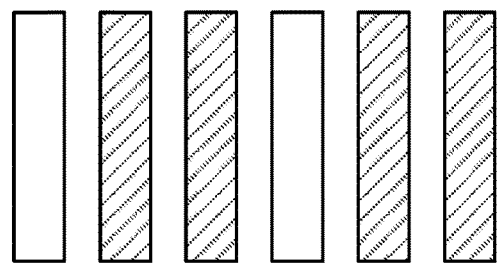

Evaluating information for the relative color density of FIG. 3C results in a total color A portion of 50% and a total color B portion of 50%. FIG. 3D is another example of a relative color density of ⅓ color A, ⅔ color B, in this case, ABBABB. In one embodiment, process information for the relative color density of FIG. 3D is calculated as a table lookup.

FIGS. 4A and 4B are embodiments of calculations of process information for relative color density in accordance with one embodiment. FIG. 4A is an interpolation between color density evaluations similar to that described for the relative color density of FIG. 3B. FIG. 4B is a table evaluation between color density evaluations similar to that described for the relative color density of FIG. 3D.

FIGS. 5A-5D are relative color density distributions in accordance with an embodiment, with an unknown color layer. The color subscript (integer 1, 2 . . . n) recognizes not only that the data might be a function of either color density, but also supports more than two colors. Shapes with unspecified color (layer class 0), in one embodiment, are distributed evenly among all layer classes. For example, in the case of two colors, no specified color corresponds to 50% relative color density, i.e. CdrDty[1]=CdrDty[2]=50%. The relative color density is quite general as a property. The relative color density can be a parameter used in an expression and can be a parameter of an interpolated table and can be a parameter of a lookup table (selecting the nearest entry to specified index values). This approach also supports more than 2 layer classes (colors). The sum of the relative densities of the various classes will always be one (100%). Evaluating such information for the relative color density of FIG. 5A results in a total color A portion of 50% and a total color 0 (layer class 0) portion of 50%. In another relative color density of a total color 0 (layer class 0) portion of 50% and a total color B portion of 50% (not shown), the information may also be evaluated. With known color groupings, other relative color densities may be calculated.

Figure 5A:
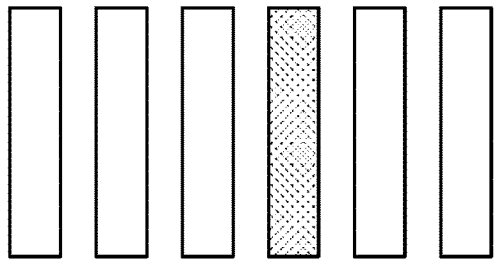
FIGS. 5A-5D are relative color density distributions in accordance with an embodiment of the present invention, with an unknown color layer.
Figure 5B:
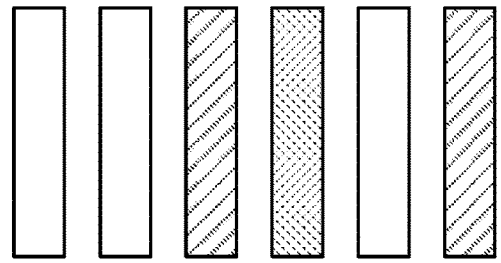
Figure 5C:
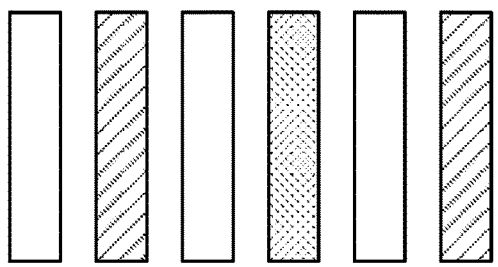
Figure 5D:
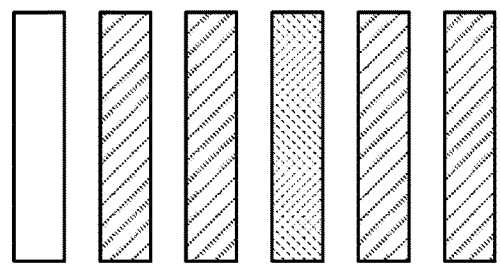

Evaluating such information for the relative color density of FIG. 5B is an example of a relative color density of a total color A portion of_____%, a total color B portion of_____% and color 0 (layer class 0) of 50% . FIG. 5C is an example of a relative color density of a total color A portion of_____%, a total color B portion of_____%, and color 0 (layer class 0) portion of 50% . In one embodiment, process information for the relative color density of FIG. 5C is calculated as a linear interpolation between that of FIG. 5A and FIG. 5B, for example resulting in an appropriate thickness to use for that color density. FIG. 5D is an example of a relative color density of a total color A portion of_____%, a total color B portion of_____%, and a total color 0 portion (layer class 0) portion of 50% .

In one embodiment with multiple colors or unknown colors, the intermediate result is a map of the various densities, for example, effective width & color density. Each point has a color density, width and spacing. In one embodiment, QuickCap or another tool uses a geometry preprocessor, such as gds2cap, to translate layout data into a density run to produce this map. This in turn translates data in each layer into a density map. Once the density map is produced the designer can convert the layout into the desired and/or required densities for the integrated circuit.

In EDA, parasitic extraction—the evaluation of parasitic capacitance and resistance—is necessary for proper modeling of physical effects for advanced process technologies. In 10 nm and 7 nm circuit design, where finer metal pitch geometries must be resolved, multi-patterning of two or more mask layers is used. For accurate modeling, the system should provide a more complex capacitance variation model, which utilizes "color", as well as accounting for adjacent metal line width and spacing effects. Color can impact resistivity, slope of edges, contact resistance, and a host of other properties. The present method supports color-aware modeling. Because physical extractors need something that is consistent, the data provided by the present system can be utilized for color aware modeling by physical extractors such as gds2cap and QuickCap by SYNOPSYS, as well as other modeling applications.

Beneficially, embodiments of the layer class relative density solution presented herein may be based on drawn shapes or etched shapes. In some embodiments, if local thickness variation needs to be smooth, then a secondary table may be used with a smoothing function, such as an average drawn width or an average etched width.

One of ordinary skill in the art will recognize that the processes such as that in FIG. 2 are conceptual representations of the operations used to perform photolithography simulation. The specific operations of the process may not be performed in the exact order shown and described. For example, blocks may not be dependent on each other, and therefore can be performed in reverse order or in parallel. The specific operations may not be performed in one continuous series of operations, and different specific operations may be performed in different embodiments. Furthermore, the process could be implemented using several sub-processes, or as part of a larger macro process. For instance, in some embodiments, the processes may be performed by one or more software applications that execute on one or more computers.

Figure 6:
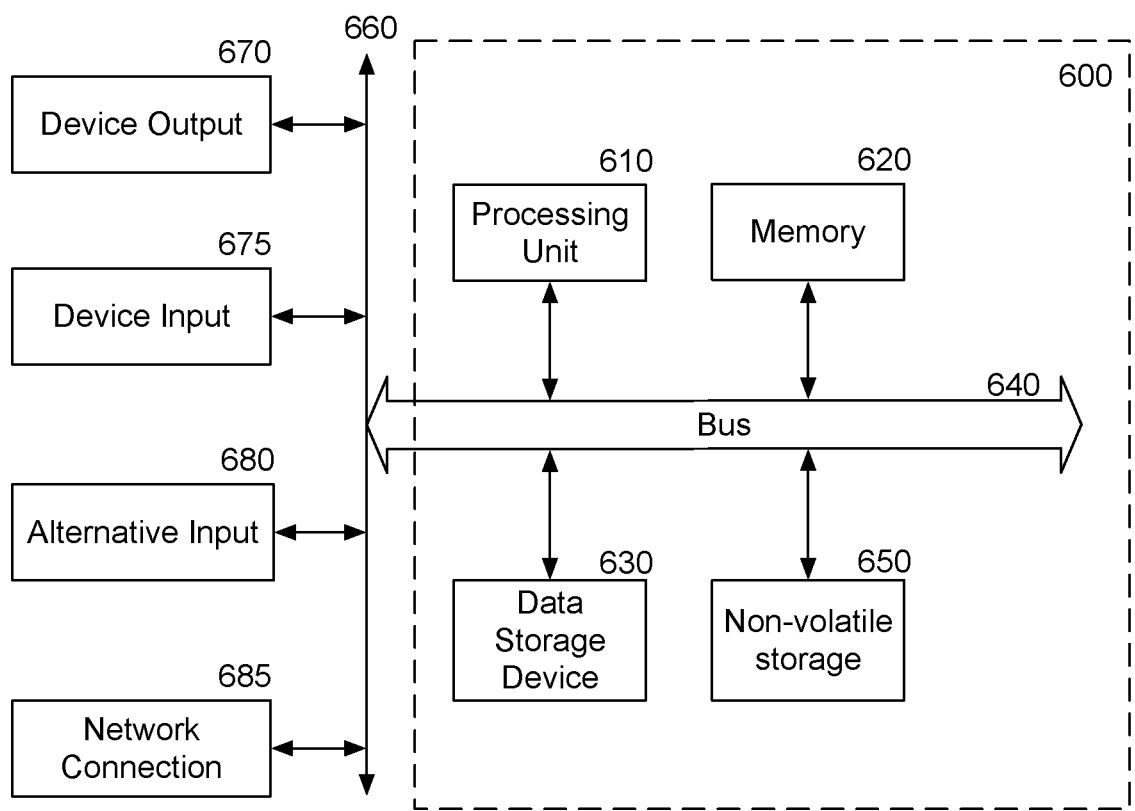
FIG. 6 shows one example of a typical computer system or data processing system that may be used with the disclosed embodiments.

As shown in FIG. 6, the computer system 600, which is a form of a data processing system, includes a bus 640, which is coupled to one or more processing units 610. In one embodiment, computer system 600 includes one or more of a storage device (e.g., ROM) 630, volatile memory (e.g., RAM) 630, and a non-volatile memory (EEPROM, Flash) 650. The processing unit 610 is coupled to cache memory in one embodiment. Cache memory may be volatile or non-volatile memory.

The bus 640 interconnects these various components together and in one embodiment interconnects these components 610, 620, 630, 650 to a device output 670 and/or device input 675. The computer system 600 may further include peripheral devices such as input/output (I/O) devices 670, 675, 680, which may be mice, keyboards, modems, network interfaces, printers, scanners, video cameras and other devices which are well known in the art. Typically, the input/output devices 670, 675, 680 are coupled to the system through input/output controllers.

In one embodiment, the volatile memory 620 is typically implemented as dynamic RAM (DRAM) which requires power continually in order to refresh or maintain data in the memory. The non-volatile memory 650 is typically a magnetic hard drive, magnetic optical drive, an optical drive, a DVD RAM, a Flash memory, or other type of memory system which maintains data even after power is removed from the system. Typically, the non-volatile memory will also be a random access memory, although this is not required.

While FIG. 6 shows that the non-volatile memory is a local device coupled directly to the rest of the components in the data processing system, it will be appreciated that the disclosed embodiments may utilize a non-volatile memory which is remote from the system, such as a network storage device which is coupled to the data processing system through a network interface such as a modem or Ethernet interface.

The bus 640 660 may include one or more buses connected to each other through various bridges, controllers and/or adapters as is well known in the art. In one embodiment an I/O controller includes a USB (Universal Serial Bus) adapter for controlling USB peripherals, and/or an IEEE-1394 bus adapter for controlling IEEE-1394 peripherals.

It will be apparent from this description that aspects of the disclosed embodiments may be embodied, at least in part, in software (or computer-readable instructions). That is, the techniques, for example the processes of FIG. 2 may be carried out in a computer system or other data processing system in response to its processor, such as a microprocessor, executing sequences of instructions contained in a memory, such as storage device 630, volatile memory 620, non-volatile memory 650, cache or a remote storage device. In various embodiments, hardwired circuitry may be used in combination with software instructions to implement the disclosed embodiments. Furthermore, while an exemplary computing device is illustrated in FIG. 6, the actual computing device implementing the described technique may be a distributed or cloud computing system in which various elements are connected over a network.

Thus, the techniques are not limited to any specific combination of hardware circuitry and software or to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as microprocessor 603.

A machine readable storage medium can be used to store software and data which when executed by a data processing system causes the system to perform various methods of the disclosed embodiments. This executable software and data may be stored in various places including, for example, storage device 630, volatile memory 620, non-volatile memory 650 and/or cache. Portions of this software and/or data may be stored in any one of these storage devices.

Thus, a machine readable storage medium includes any mechanism that stores any information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

The detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The detailed description is, therefore, not to be taken in a limiting sense, and the scope of the present invention is defined by the appended claims.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed description were presented as procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "sending" or "receiving" or "displaying" or "calculating" or "determining" or "multiplying" or "computing" or "identifying" or "generating" or "transforming" the like, refer to the action and processes of a computer system, or similar electronic computing device that manipulates and transforms data represented as physical (electronic) quantities within the computer system's registers and memories and other computer readable media into other data similarly represented as physical quantities within the computer system's memories or registers or other such information storage, transmission or display devices.

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

I claim:

1. A computer-implemented method of improving optical lithography for a multi-color process, the method comprising:
   receiving an integrated circuit (IC) design comprising a metal layer of multiple colors;
   determining a measure of relative density of the multiple colors at a window within the IC design; and
   generating a model for the IC design by interpolating between two or more predetermined color densities based on the measure of relative density of the colors at the window.

2. The method of claim 1, further comprising the window being a moving window, through the IC design, corresponding to positions within the IC design, wherein the measure of the relative density of colors is determined within the positions of the moving window.

3. The method of claim 1, wherein the relative density of the colors is based on one of: an area and a length.

4. The method of claim 1, wherein the relative density of the colors is a parameter in a polynomial expression.

5. The method of claim 1, wherein the relative density of the colors is used as one or more arguments in a table.

6. The method of claim 1, wherein the relative density of the colors is used to interpolate between a plurality of tables.

7. The method of claim 1, wherein the relative density of the colors is one of: a drawn density and an etched density.

8. The method of claim 1, wherein the relative layer-class density is a weighted average of values based on a plurality of window sizes.

9. The method of claim 1, wherein the relative density of a layer class is a measure of a characteristic of a layer class divided by a sum of the measures of all layer classes.

10. A system to perform optical lithography simulation for an integrated circuit design, comprising:
   a processor configured to receive process test structures of the integrated circuit design comprising a metal layer of two or more colors and to determine a measure of relative density of the two or more colors at a window within the IC design,
   the processor configured to generate a model for the IC design based on the measure of relative density of the two or more colors at the window, by interpolating between two or more predetermined densities based on the measure of relative density; and
   a memory to store the data of relative density of the two or more colors at the position in the integrated circuit density for future processing.

11. The system of claim 10, further comprising the window being a moving window, through the IC design, corresponding to positions within the IC design, wherein the measure of the relative density of colors is determined within the positions of the moving window.

12. The system of claim 10, wherein the relative density of colors is based on one of: an area and a length.

13. The system of claim 10, wherein the relative density of colors is a parameter in a polynomial expression.

14. The system of claim 10, wherein the relative density of colors is used as one or more arguments in a table.

15. The system of claim 10, wherein the relative density of colors is one of: a drawn density and an etched density.

16. A computer-implemented method of improving optical lithography for a multi-color process, the method comprising:
   receiving an integrated circuit (IC) design comprising a metal layer of multiple colors;
   determining a measure of relative density of the multiple colors at a window within the IC design; and
   generating a thickness model for the IC design by interpolating a thickness between two or more predetermined color densities based on the measure of relative density of the colors at the window.

17. The method of claim 16, further comprising the window being a moving window, through the IC design, corresponding to the position within the IC design, wherein the measure of the relative density of colors is determined within the window.

18. The method of claim 16, wherein the relative density of colors is based on one of: an area and a length.

19. The method of claim 16, wherein the relative density of colors is a parameter in a polynomial expression.

20. The method of claim 16, wherein the relative density of colors is used as one or more arguments in a table.

21. The method of claim 16, wherein the relative density of colors is one of: a drawn density and an etched density.

* * * * *